(12) United States Patent  
Krishnamurthy et al.

(10) Patent No.: US 8,193,953 B1
(45) Date of Patent: Jun. 5, 2012

(54) DATA WIDTH SCALER CIRCUITRY

(75) Inventors: Gopi Krishnamurthy, Tracy, CA (US); Curt Wortman, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 144 days.

(21) Appl. No.: 12/780,478

(22) Filed: May 14, 2010

(51) Int. Cl.
*H03M 7/00* (2006.01)

(52) U.S. Cl. .......................... 341/60; 341/51

(58) Field of Classification Search .......... 341/60, 341/61, 51, 95, 102
See application file for complete search history.

(56) References Cited

U.S. PATENT DOCUMENTS

| | | | |
|---|---|---|---|
| 6,822,589 B1 * | 11/2004 | Dye et al. .................. | 341/51 |
| 7,064,685 B1 | 6/2006 | Xue et al. | |
| 7,129,860 B2 * | 10/2006 | Alvarez et al. ............ | 341/51 |
| 7,151,470 B1 | 12/2006 | Xue et al. | |
| 7,240,133 B1 | 7/2007 | Xue | |
| 2004/0012614 A1 * | 1/2004 | Shim et al. ................ | 345/660 |
| 2009/0003730 A1 * | 1/2009 | Pande et al. ............... | 382/298 |
| 2009/0257445 A1 | 10/2009 | Chan et al. | |

* cited by examiner

*Primary Examiner* — Brian Young
(74) *Attorney, Agent, or Firm* — Ropes & Gray LLP (57) ABSTRACT

Circuitry for scaling data from a first width (e.g., number of simultaneously presented parallel data signals) to a second width can preferably operate for any of a wide range of different ratios between the first and second widths (including ratios that are non-integer or even non-rational) without the need for more than one clock signal.

29 Claims, 7 Drawing Sheets

FIG. 1

If (muxsel = [(α∗m)-n]) AND (valid_cnt = 0)

muxsel = 0 valid_cnt = α-1 else if (valid_cnt = 0)

muxsel = muxsel + [n-m]

else valid_cnt = valid_cnt -1;

FIG. 2

If (validin)

muxsel = muxsel - [m-n]

else muxsel = muxsel + n

DATA WIDTH SCALER CIRCUITRY

BACKGROUND

This disclosure relates to circuitry for converting data that is input as successive groups of parallel data bit signals, each of the input groups having a first number of data bits, to successive groups of parallel data bit output signals, each of the output groups having a second number of data bits, the second number being different from the first number. Such circuitry may be referred to as data width scaler circuitry. Each bit that goes into such data width scaler circuitry corresponds to one respective bit that comes out of the circuitry. (A "bit" is a binary digit.)

Data width scaler circuitry may be needed in any of a variety of contexts. For example, a received serial data signal may include multidigit payload data bit words that are "padded" with one or more "header" data bits. The header data bits may be used for such purposes and indicating where word boundaries are, parity checking, cyclic redundancy checking, reducing or eliminating possible DC (direct current) bias of the payload data, etc. The receiving circuitry may covert the received serial data signal to successive groups or blocks of parallel data signal bits. These input blocks may include both payload and padding bits, and they must typically be formed at a rate (i.e., a clock signal rate) that keeps pace with the rate at which bits are arriving in the serial data signal. On the other hand, at least some circuitry downstream from the receiver circuitry may need only the payload data, so that one function that may need to be performed between the receiver circuitry and the downstream circuitry is to eliminate the padding bits. This may effectively change the "width" of the data groups as they pass from the receiver circuitry to the downstream circuitry.

Another function that is often thought to be required in an interface between receiver circuitry and downstream circuitry as described above is to change the clock rate between a first clock rate used by the receiver circuitry and a second clock rate used by the downstream circuitry. The receiver circuitry typically needs to operate at a clock rate that is dictated by the rate at which successive bits arrive in the received serial data signal. On the other hand, it is typically preferred to operate at least some of the downstream circuitry at a clock rate that is a function of the rate at which payload data words are present in the received signal. Because of the presence of padding bits in the received serial data signal, fairly complex circuitry may be required to provide both the first clock signal needed by the receiver circuitry, and the second clock signal (having a different frequency from the first clock signal) needed by the downstream circuitry.

As an example of the foregoing, certain industry-standard serial data communication protocols provide two padding bits for every 64 data payload bits. Other industry-standard serial communication protocols provide three padding bits for every 64 data payload bits. Just this small set of examples illustrates two problems. First, the ratio between the serial data receiver circuitry clock signal frequency and the clock signal frequency needed by the more downstream circuitry that deals only with the payload data can be quite complex (e.g., a clock signal frequency ratio that is related to the ratio 66:64 (which is an example of a non-integer ratio) or the ratio 67:64 (which is another example of a ratio that is non-integer). Second, if it is desired to provide circuitry that can support any of several different communication protocols, the differences among such protocols make that quite difficult to do. For example, general-purpose circuitry that can support both 66:64 and 67:64 data width and clock frequency shifts may need to be quite complex. And these are only some examples of the various communication protocols that it may be desirable for relatively general-purpose circuitry to be able to support. Adding more protocol options to the capabilities of such circuitry tends to increase the complexity of the circuitry even more. Some protocols may even require ratios that are non-rational.

SUMMARY

In accordance with certain possible aspects of this disclosure, data scaler circuitry is provided that can convert successive groups of input data bits having any desired input group width to successive groups of output data bits having any desired output group width. For example, the input group width can be larger or smaller than the output group width. In addition, the data width scaler circuitry can use the same clock signal to time both the reception of successive input groups and the output of successive output groups. This principle of being able to use the same clock signal for timing both the input and output groups applies regardless of the ratio between the widths of the input and output groups.

Further features of the disclosure, its nature and various advantages will be more apparent from the accompanying drawings and the following detailed description.

DETAILED DESCRIPTION

Figure 1:
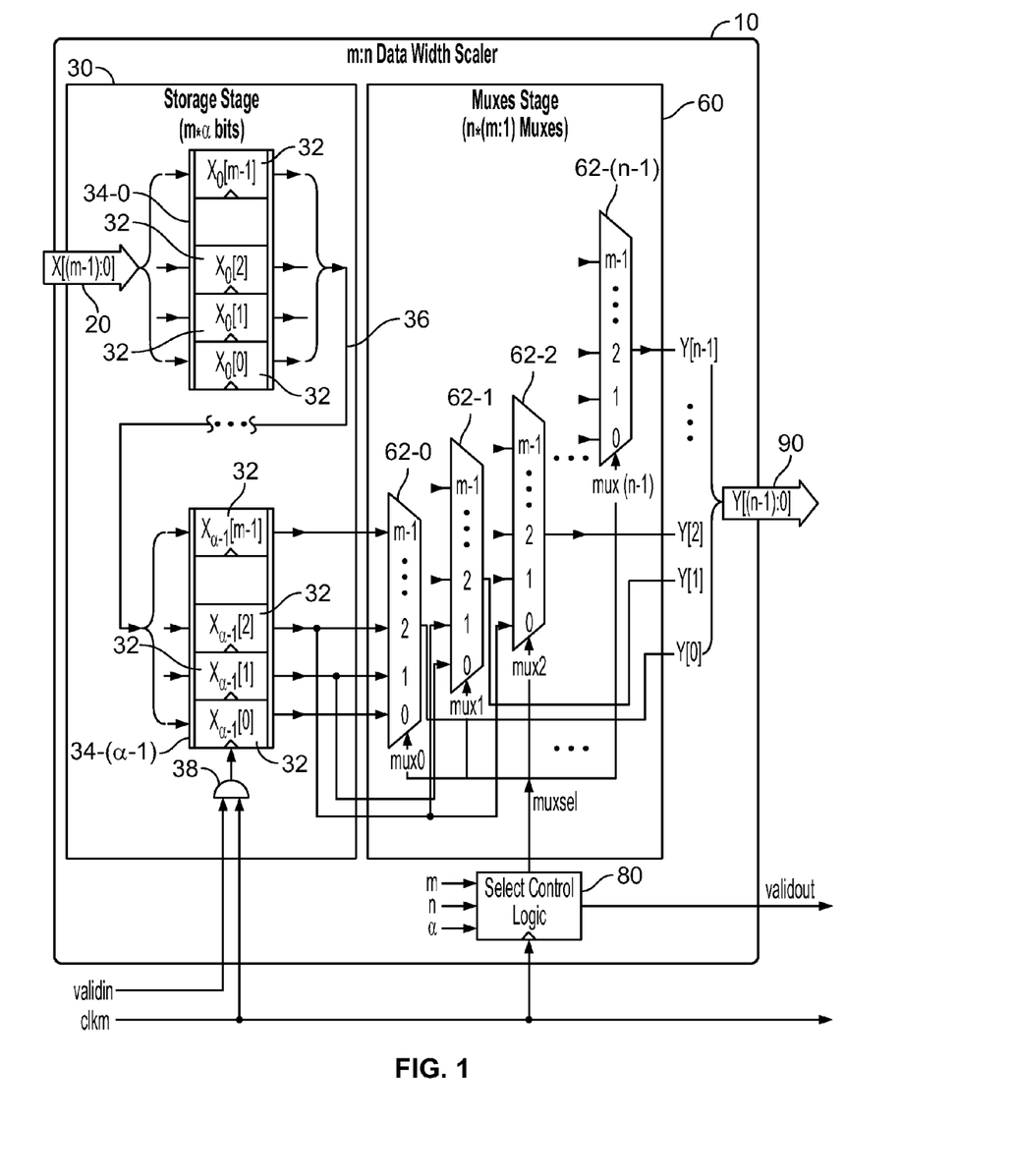
FIG. 1 is a simplified schematic block diagram of an illustrative embodiment of circuitry in accordance with certain possible aspects of this disclosure.
Figure 6:
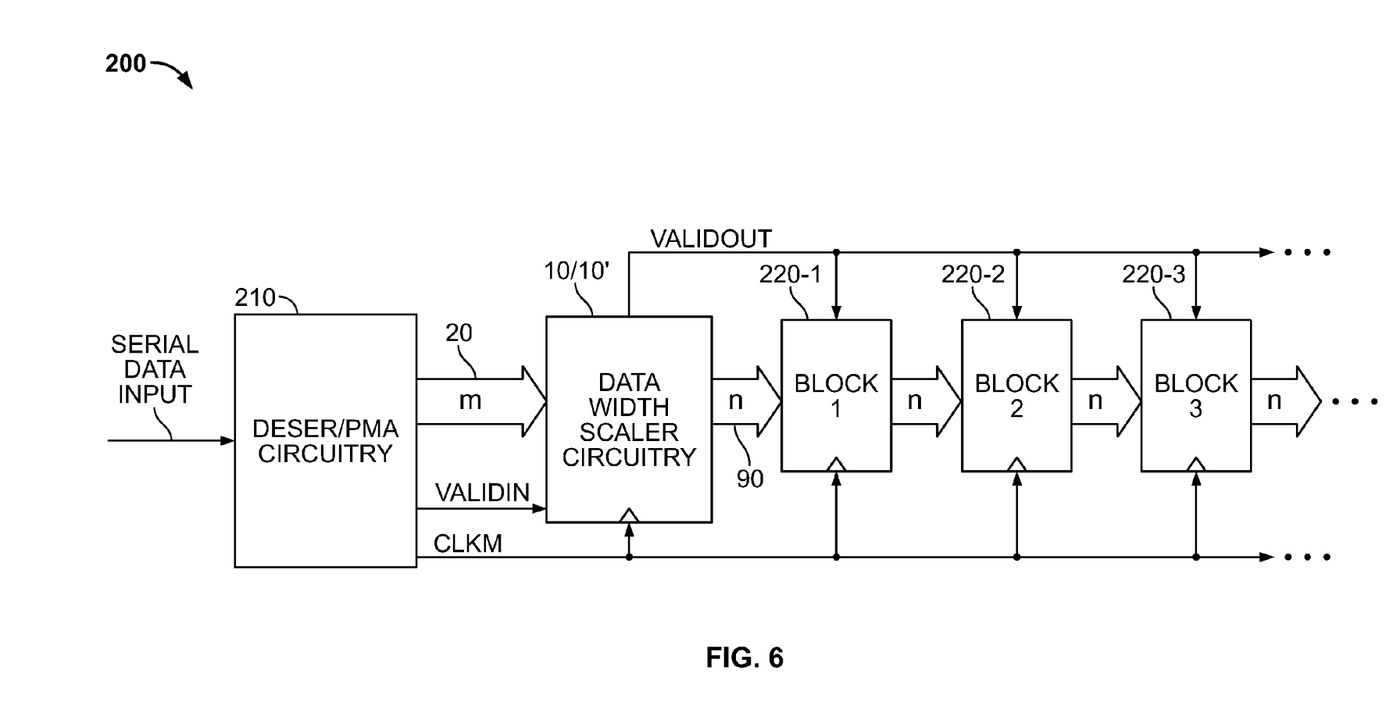
FIG. 6 is a simplified schematic block diagram of an illustrative embodiment of a somewhat larger system in accordance with certain possible aspects of the disclosure.
Figure 7:
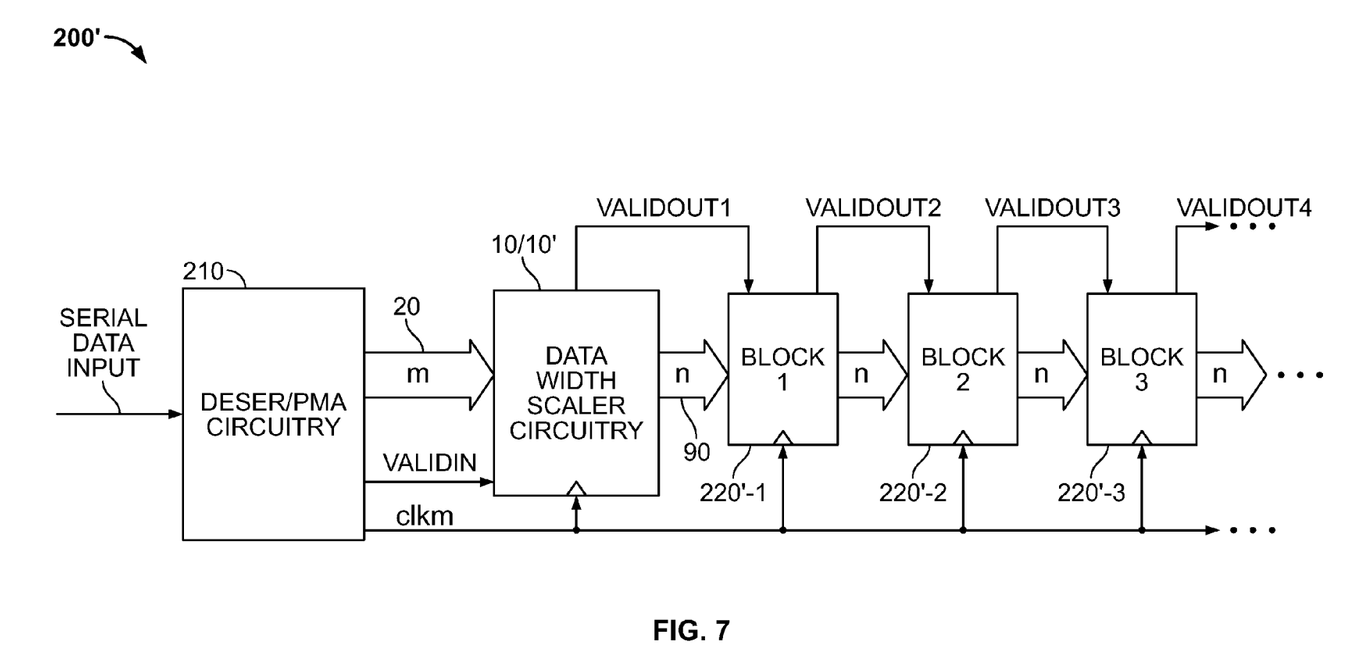
FIG. 7 is similar to FIG. 6, but for an illustrative alternative embodiment of circuitry of the general type shown in FIG. 6 in accordance with certain other possible aspects of the disclosure.
Figure 8:
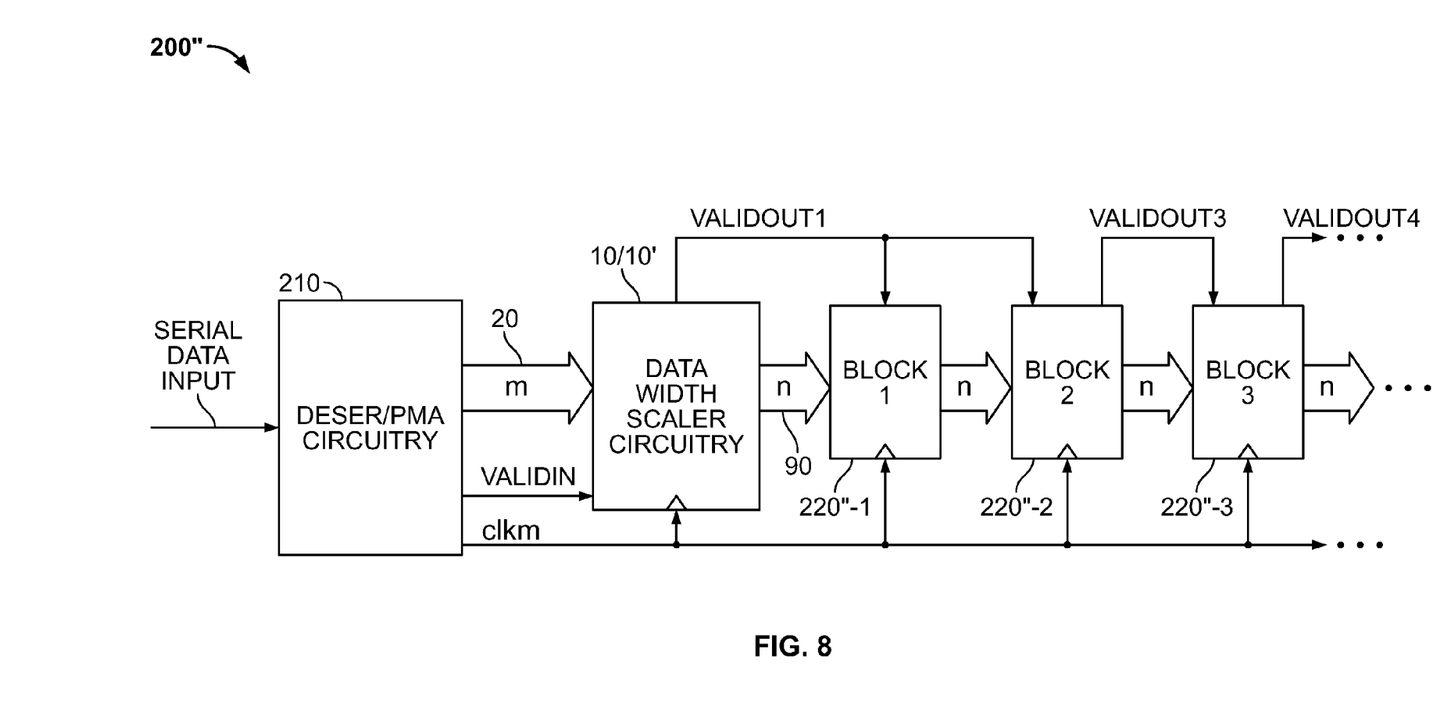
FIG. 8 is again similar to FIGS. 6 and 7, but for another illustrative alternative embodiment of circuitry of the general type shown in FIGS. 6 and 7 in accordance with certain still other possible aspects of the disclosure.

An illustrative embodiment of data width scaler circuitry 10 in accordance with certain possible aspects of this disclosure is shown in FIG. 1. Circuitry 10 is able to convert data from an input, parallel data bus width that is m bits wide to an output, parallel data bus width that is n bits wide. In other words, scaler input data bus 20 includes m parallel data signal leads for presenting m bits of input data X[(m−1):0] to scaler 10 in parallel (i.e., simultaneously or concurrently). Each such group of parallel input data bits is one group in a succession of such groups, each of which groups is presented (or is available) on bus 20 concurrently with a respective one of a succession of pulses in a clock signal clkm while a validin signal is being asserted (i.e., while validin is logic 1). (The validin signal may be asserted whenever circuitry upstream from circuitry 10 is outputting a block of valid data X[(m−1):0]. For example, later-described FIGS. 6-8 show that the validin signal can come from deserializer/physical-media-access circuitry 210 upstream from data width scaler circuitry 10.) Similarly, scaler output data bus 90 includes n parallel data signal leads for outputting n bits of output data Y[(n−1):0] from scaler 10 in parallel (i.e., simultaneously or concurrently). Each such group of parallel output data bits is one group in a succession of such groups, each of which groups is presented (or is available) on bus 90 concurrently with a respective one of a succession of pulses in the clkm signal while a validout signal is being asserted (i.e., while validout is logic 1). Typically, m is a number that is different from n; and preferably m can be either larger or smaller than n. In most cases, m and n are both numbers that are greater than 1. However, in certain cases either m or n can be 1. These cases are relatively rare or infrequent; and so to simplify this discussion, it will generally be assumed herein that m and n are both "plural" numbers (i.e., numbers larger than 1).

Three main portions of circuitry 10 that are shown in FIG. 1 are data storage circuitry 30, multiplexer circuitry 60, and select control logic circuitry 80.

Data storage circuitry 30 includes a plurality (i.e., a number greater than 1) of data storage registers (e.g., flip-flops) 32. Each of registers 32 is capable of receiving, storing, and outputting one bit of data in synchronism with a pulse in the clkm signal while AND gate 38 is enabled by assertion of the validin signal. The output signal of AND gate 38 is applied to the clock input terminal of each register 32. For example, each register 32 may store the data signal bit currently being applied to its data input lead in response to a rising edge in the output signal of AND gate 38. Each register 32 outputs the thus-stored data bit (via its data output lead) after the rising edge in the AND gate 38 output signal has passed.

Adjacent ones of registers 32 are grouped into a plurality of subsets or subpluralities of the registers. (A subplurality is also a number of registers 32 greater than 1, but it is a smaller number than the total number of registers 32 (i.e., the larger, total, "plurality" of registers 32).) For example, the first such subplurality of registers 32 is identified in FIG. 1 as $X_0[0]$ through $X_0[m-1]$, and a last such subplurality of registers 32 is identified in FIG. 1 as $X_{\alpha-1}[0]$ through $X_{\alpha-1}[m-1]$. There may be any desired number of other such subpluralities of registers 32 between the first and last subpluralities (or there may be no such other subpluralities of registers between the first and last subpluralities).

Each such subplurality includes the same number of registers 32 (i.e., m registers 32). All of the registers 32 in each such subplurality may be thought of and described as "adjacent" to one another. Those skilled in the art will appreciate that "adjacent" in this context is a term that is primarily used for convenience, and that it has more to do with logical adjacency or data-bit-position adjacency rather than physical adjacency (although physical adjacency is also possible). In addition, all of the subpluralities are mutually exclusive of one another. This means that each register 32 is included in no more than one of the subpluralities. A further preference is for all of the subpluralities to be "adjacent" to one another (in the same general sense that the registers in each subplurality are adjacent to one another as described above). Thus, for example, if there are only two subpluralities (the $X_0$ subplurality and the $X_{\alpha-1}$ subplurality), then register $X_{\alpha-1}[m-1]$ is preferably "adjacent" to register $X_0[0]$. As another example, if there are three subpluralities (the $X_0$ subplurality followed by an $X_1$ subplurality, and then the $X_{\alpha-1}$ subplurality following the $X_1$ subplurality), then register $X_{\alpha-1}[m-1]$ is preferably "adjacent" to register $X_1[0]$, and register $X_1[m-1]$ is preferably "adjacent" to register $X_0[0]$.

To simplify the discussion, the above-described subpluralities of registers 32 may sometimes be referred to as subplurality 34-0 (for the registers marked $X_0[0]$ through $X_0[m-1]$), subplurality 34-1 (for registers $X_1[0]$ through $X_1[m-1]$), and so on, ending with subplurality 34-($\alpha-1$) (for registers marked $X_{\alpha-1}[0]$ through $X_{\alpha-1}[m]$).

Storage stage 30 also includes routing circuitry 36 for conveying the data signal outputs of all of the registers 32 in each subplurality 34 in parallel to the data signal inputs of the registers 32 in the next adjacent subplurality 34. For example, assuming that subplurality 34-0 is followed by subplurality 34-1, which is followed by subplurality 34-($\alpha-1$), then a first leg or portion of routing circuitry 36 conveys (applies) the data output signals of subplurality 34-0 in parallel to the data inputs of subplurality 34-1, and a second leg or portion of routing circuitry 36 conveys (applies) the data output signals of subplurality 34-1 in parallel to the data inputs of subplurality 34-($\alpha-1$). Thus routing circuitry 36 may be thought of and described as connecting the adjacent subpluralities in a series of such subpluralities (e.g., subplurality 34-0 being followed in such a series by subplurality 34-1, and with subplurality 34-($\alpha-1$) following subplurality 34-1 in the series).

The above-described parallel connections in each portion of routing circuitry 36 are preferably such that each register 32 in each subplurality 34 is connected by a respective lead in routing circuitry 36 to a corresponding or respective one of the registers 32 in the next subplurality 34 in the series of the subpluralities. Thus, for example, in the above example of a series of subpluralities 34-0, 34-1, and 34-($\alpha-1$), a first portion of routing circuitry 36 connects the data output of register $X_0[0]$ to the data input of register $X_1[0]$, and a second portion of routing circuitry 36 connects the data output of register $X_1[0]$ to the data input of register $X_{\alpha-1}[0]$. As another similar example (now described more briefly), routing circuitry 36 connects the data output of register $X_0[m]$ to the data input of register $X_1[m]$, and it then connects the data output of register $X_1[m]$ to the data input of register $X_{\alpha-1}[m]$.

Multiplexer circuitry 60 includes a plurality of m-to-1 multiplexer circuits 62. There may be one such multiplexer circuit 62 for each of the n parallel output leads in output bus 90. Thus multiplexer circuits 62 may be individually identified as multiplexer ("mux") 62-0, mux 62-1, mux 62-2, and so on up to mux 62-($n-1$).

Each of muxes 62 has m selectable data inputs. Each of muxes 62 also has selection control inputs (from later-described select control logic circuitry 80) for controlling which one of its m data input signals that mux 62 will select to be its data output signal. As will be more fully described below, the selection control input signals muxsel from circuitry 80 are typically dynamic (i.e., time-varying) signals that therefore cause muxes 62 to make different input-to-output selections (connections) at different times during operation of circuitry 10.

The m data inputs to each mux 62 may be respectively numbered 0 through m−1; and in this illustrative embodiment, each mux 62 responds to the muxsel signals having a particular binary numerical value by selecting as its data output the one of its data inputs that is numbered with that same numerical value. For example, if the binary numerical value of the selection control signals muxsel from circuitry 80 is 0, then each of muxes 62 will select its "0" data input signal to be its data output signal. As another similar example, if the muxsel signals from circuitry 80 have binary numerical value equal to 1, then each of muxes 62 selects its "1" data input signal to be its data output signal. As still another similar example, if the muxsel signals from circuitry 80 have binary numerical value m−1, then each of muxes 62 selects its "m−1" data input signal to be its data output signal.

The m data inputs to each mux 62 come from the data outputs of a respective different group of m adjacent ones of registers 32. (Each of these groups may alternatively be referred to as a subset, a subplurality, or a submultiplicity of registers 32. Because m is usually a number greater than 1, such a "group," "subset," "subplurality," or "submultiplicity" is also a number of registers 32 greater than 1; but it is also less than the total number of registers 32 in the circuitry as a whole.) Assume, for example, that subplurality 34-0 is followed by subplurality 34-1, which is followed in turn by subplurality 34-($\propto$−1), then the m data inputs to mux 62-0 came from (are connected to) the m data outputs of the m registers in subplurality 34-($\propto$−1). In particular, the 0 through m−1 data inputs to mux 62-0 are respectively connected to the data outputs of registers $X_{\propto-1}[0]$ through $X_{\propto-1}[m-1]$. Continuing with this example, the 0 through m−1 data inputs to mux 62-1 are respectively connected to the data outputs of registers $X_{\propto-1}[1]$ through $X_{\propto-1}[m-1]$ and $X_1[0]$. In other words, the data inputs to mux 62-1 are offset by one register position relative to the data inputs to mux 62-0. Continuing on with this example, the 0 through m−1 data inputs to mux 62-2 are respectively connected to the data outputs of $X_{\propto-1}[2]$ through $X_{\propto-1}[m-1]$, $X_1[0]$, and $X_1[1]$. Thus again, the data inputs to mux 62-2 are offset by one more register position relative to the data inputs to mux 62-1. This incremental offsetting of the data inputs to successive ones of muxes 62 along the population of adjacent register 32 data outputs continues in this fashion up to and including mux 62-(n−1).

As has been mentioned, there is one mux 62 for each of the n leads in output bus 90; and in particular, the data output lead of each of muxes 62-0 through 62-(n−1) is connected (supplies the data output signal) to a respective one of these output signal leads Y[(n−1):0].

From the foregoing it will be seen that m indicates the data width of the input data X, n indicates the data width of the output data Y, and $\propto$ indicates the number of stages 34 of storage. Storage circuitry 30 needs a number ($\propto$) of stages 34 sufficient to enable the circuitry as a whole to form the correct n width output. For example, for data width expansion (i.e., cases in which m is less than n), $\propto$ can be determined from the formula $$\propto = (n \bmod m)+1,$$

where "mod" stands for the arithmetic operation "modulo," meaning truncate the quotient that results from dividing n by m to just the "whole number" (integer) part of that quotient. Thus 4 mod 3 is 1, making $\propto$2 in accordance with the above formula. As another example, 33 mod 32 is also 1, making $\propto$2 again. But 32 mod 1 is 32, making $\propto$33.

On the other hand, for data width reduction (i.e., cases in which m is greater than n), $\propto$ can always be 2.

Figure 2:
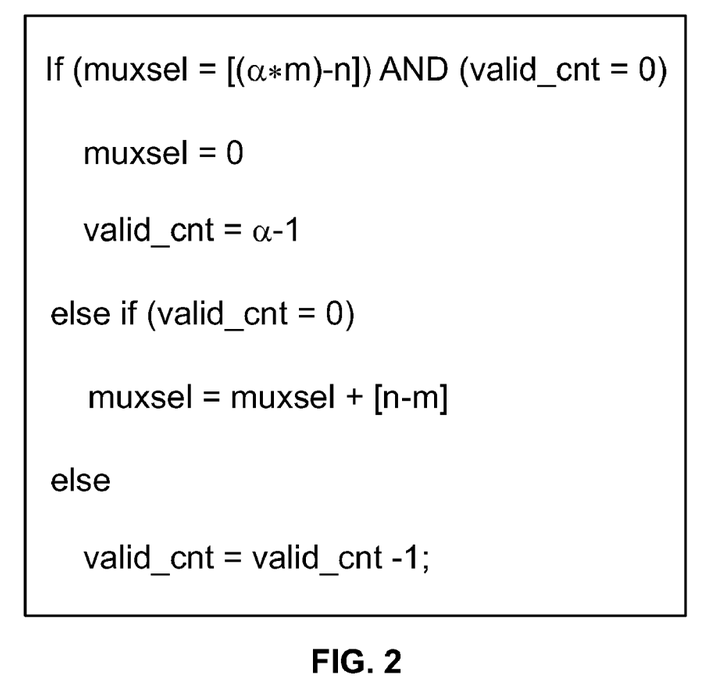
FIG. 2 is an illustrative embodiment of logic that may be performed, under certain conditions, by a portion of circuitry like that illustrated by FIG. 1 in accordance with certain possible aspects of the disclosure.

Select control logic circuitry 80 can operate in either of two different modes, depending on whether data width scaler circuitry 10 is operating in data width expansion mode (m less than n), or data width reduction mode (m greater than n). FIG. 2 shows an illustrative embodiment of logical operations that circuitry 80 can perform in data width expansion mode. In this FIG. (and other similar uses) the parameter muxsel is the numerical value of the selection control signals that circuitry 80 outputs and applies to the selection control inputs of muxes 62 as described above. The first three lines of the logic in FIG. 2 reset both a muxsel counter and a valid_cnt counter in any operating cycle of circuitry 80 in which the condition in the first line is true. (The muxsel counter is (at least in this mode) basically an incrementing counter (i.e., a counter whose output increases in accordance with the fifth line in FIG. 2 whenever that fifth line is performed). The valid_cnt counter is a decrementing counter (i.e., a counter whose output decreases in accordance with the seventh line in FIG. 2 whenever that seventh line is performed).) The first line in FIG. 2 is true if (1) the current value of muxsel is equal to ($\propto$ times m) minus n, and (2), at the same time, the valid_cnt counter output is 0. If the first line is true, then the second line in FIG. 2 is performed to reset the muxsel counter to 0, and the third line in FIG. 2 is performed to reset the valid_cnt counter to $\propto$ minus 1. The remaining lines of FIG. 2 are not performed in any operating cycle in which the first line is true as discussed above. Each cycle of clkm causes one operating cycle of circuitry 80.

In any operating cycle of the circuitry in which the first line in FIG. 2 is not true, then the fourth line in FIG. 2 is performed. This fourth line tests whether valid_cnt has been decremented to 0. If so, then the fifth line in FIG. 2 is performed to increment muxsel to its current value plus n minus m, and the remaining lines in FIG. 2 are not performed. On the other hand, in any operating cycle in which both the first and fourth lines in FIG. 2 are not true, then the sixth and seventh lines in FIG. 2 are performed to decrement valid_cnt by 1.

Figure 3:
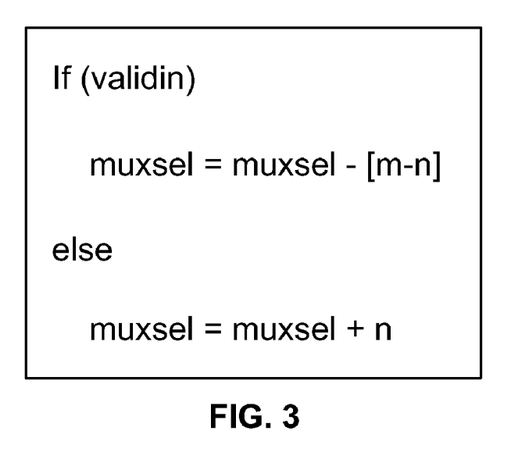
FIG. 3 is an illustrative embodiment of logic that may be performed, under certain other conditions, by a portion of circuitry like that illustrated in FIG. 1 in accordance with certain other possible aspects of the disclosure.

Turning now to operation of select control logic circuitry 80 in data width reduction mode (m greater than n), FIG. 3 shows an illustrative embodiment of logical operations that circuitry 80 can perform in such data width reduction mode. The first line in FIG. 3 tests whether or not validin is being asserted (i.e., whether or not validin is logic 1). In data width reduction mode, assertion of validin is based on the ratio of m to n. For example, if the ratio of m to n is 2, validin is asserted every other clock cycle. As another example, if the ratio of m to n is 4, validin is asserted every fourth clock cycle. As still another example, if m is 4 and n is 3, validin is asserted for 3 out of every 4 clock cycles (i.e., validin is not asserted every fourth clock cycle).

Returning to the first line of FIG. 3, if validin is being asserted, then line 2 is performed to decrement the current value of muxsel by the difference between m and n (m is always larger than n in this mode). The remaining lines in FIG. 3 are not performed during this clock cycle. On the other hand, if the first line in FIG. 3 finds that validin is not being asserted, then line 2 in FIG. 3 is not performed, but lines 3 and 4 are performed. In particular, line 4 in FIG. 3 causes the current value of muxsel to be increased by n.

An additional function that circuitry 80 can perform is to produce the above-mentioned validout signal. In data width expansion cases (FIG. 2 applicable as described above), the validin signal is always high (asserted, "logical 1," "logic 1"), and circuitry 80 controls validout to be high whenever valid_cnt is not equal to 0.

In data width reduction mode (i.e., when m>n), validout can be high at all times.

With the benefit of the foregoing, certain aspects of operation of data width scaler circuitry 10 can be recapitulated as follows. Storage stage 30 acts somewhat like a shift register in that it accepts successive groups of m data bits X[(m−1):0] in synchronism with the clkm signal while validin is high, and also shifts those groups through the successive stages 34-0, 34-1, 34-2, . . . , 34-($\propto$−1), also in synchronism with the clkm signal while validin is high. Of course, these successive groups of m X bits are handled completely in parallel in storage stage 30. The effect of this construction and operation of storage stage 30 is to make ∝ successive groups of m X bits available in parallel as source data for the inputs to muxes 62. The connectivity from the data outputs of registers 32 to the data inputs of muxes 62 is shown in representative part in FIG. 1 and described in detail above. Muxes 62 are then controlled by the muxsel signals to select from among their various data inputs successive groups of n output signals, which are output as Y[(n−1):0] in synchronism with the clkm signal while validout is high.

The above describes what may be referred to as the "simple" mode of operating data width scaler circuitry 10. As a specific example of operation in the simple mode, if m=3 and n=4, then the output data Y will have the following pattern in successive cycles of the clkm signal: Y[3:0], Y[3:0], Y[3:0], gap, Y[3:0], Y[3:0], Y[3:0], gap, Y[3:0], ... "Gap" indicates a cycle of the clkm signal in which the outputs of muxes 62 do not constitute valid output data. The validout signal is therefore de-asserted (i.e., validout is logic 0) during any such "gap" clkm cycle. (Of course, the validout signal is asserted (i.e., validout is logic 1) during each clkm cycle in which the outputs of muxes 62 are valid "Y[3:0]" data.) The "gear ratio" of circuitry 10 in this example is 3:4.

Data width scaler circuitry 10 may also be operated in what may be called a "complex" mode. This mode can be employed if the user of the circuitry needs to separate "sync" header bits (or the like) from "payload" data in a block. In complex mode, circuitry 10 converts m-bit wide data to n-bit wide data only every β cycle of the clkm signal. During clkm signal cycles between the β cycles, circuitry 10 acts as a 1:1 scaler. For example, if m=3, n=4, and β=2, the Y output data will have the following pattern:

$$\{Y[3:0], Y[2:0], Y[2:0]\},$$
$$\{Y[3:0], Y[2:0], Y[2:0]\},$$
$$\{Y[3:0], Y[2:0], Y[2:0]\},$$
$$\text{gap}, \ldots$$
$$\{Y[3:0], Y[2:0], Y[2:0]\},$$
$$\{Y[3:0], Y[2:0], Y[2:0]\},$$
$$\{Y[3:0], Y[2:0], Y[2:0]\},$$
$$\text{gap}, \ldots$$

The data within { } may be referred to as a block. "Gap" has the same meaning as before. The header bit in each such block is the first bit (i.e., the only Y[3] bit) in each block. It will be apparent that this bit comes out of circuitry 10 on a lead (Y[3]) that is never used for any payload data (all of which payload data comes out of circuitry 10 on leads Y[2:0]). Accordingly, circuitry 10 has operated to separate the header bit from the payload bits.

The complex mode of operating circuitry 10 can be implemented, for example, in the following way. β is made another input to select control logic circuitry 80. A clkm counter is added to circuitry 80. The clkm counter counts clkm cycles until that count equals β. In that clock cycle, the various parameters like muxsel and valid_cnt in circuitry 80 are allowed to change as described earlier in this specification, and the clkm counter is then reset. The muxsel and valid_cnt parameters in circuitry 80 are not allowed to change in any clock cycle in which the clkm count is not equal to β.

A possible benefit of the invention is that it provides a way that data width scaler circuitry 10 can be constructed so that one such general-purpose or relatively general-purpose construction can be operated for any of a wide range of different values of m and n. For example, if, in accordance with the discussion earlier in this specification, circuitry 10 is constructed with m=M, n=N, and ∝=A, then that circuitry 10 can support any data width scaling operation in which the desired value of m (now referred to as $m_d$) is less than or equal to M, the desired value of n (now referred to as $n_d$) is less than or equal to N, and the value of ∝ (now referred to as $\propto_d$, and determined from m=$m_d$ and n=$n_d$ as described earlier in this specification) is less than or equal to A. If $m_d$ is less than M, then leads X[($m_d$−1):0] may be used for the input data blocks. Similarly, if $n_d$ is less than N, then leads Y[($n_d$−1):0] may be used for the output data blocks.

Figure 4:
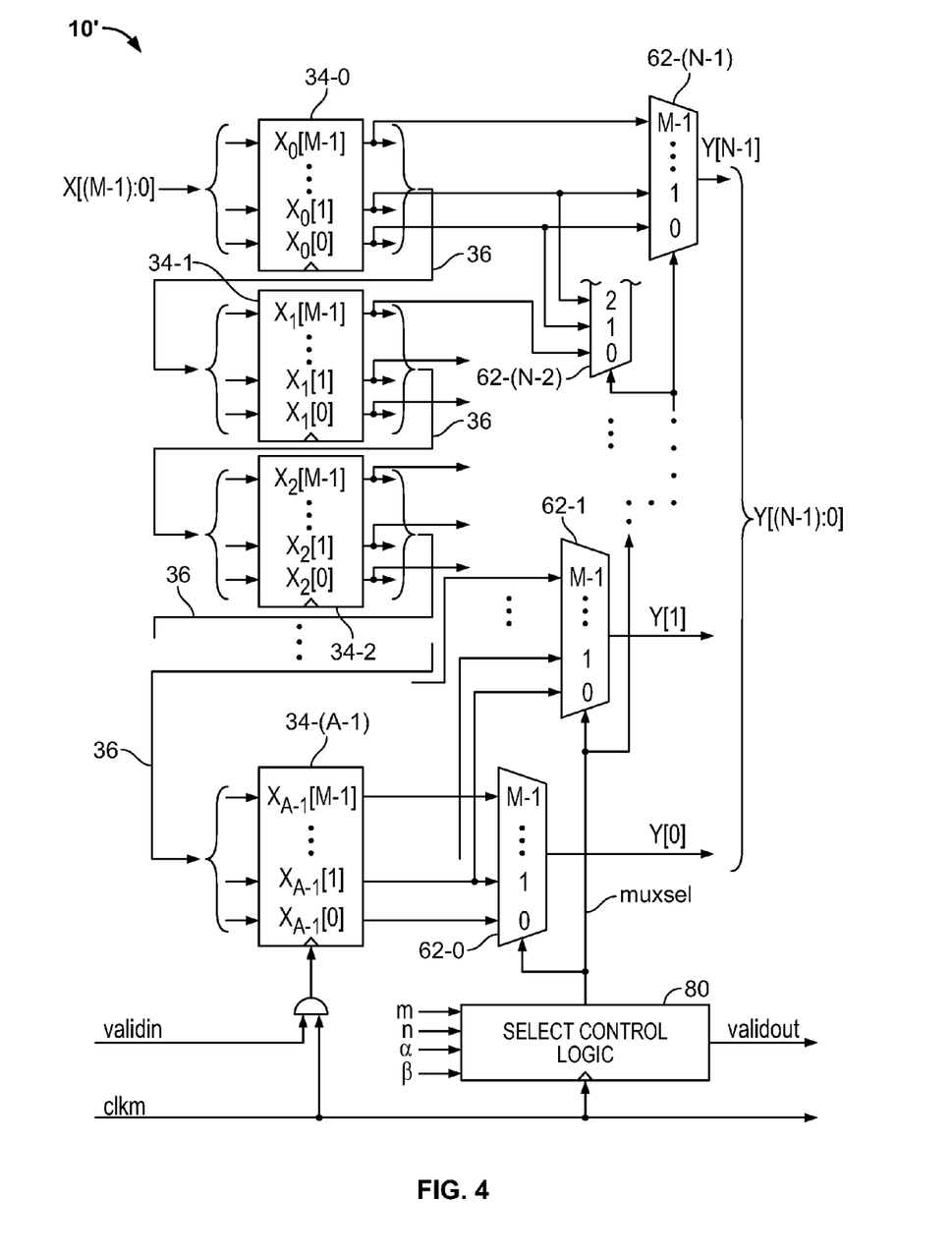
FIG. 4 is similar to FIG. 1, but shows a construction of the circuitry with a particular (parameterized) size in accordance with certain possible aspects of the disclosure.

FIG. 4 shows an illustrative embodiment of the type of single, relatively general-purpose construction of data width scaler circuitry that is mentioned above. Thus circuitry 10' in FIG. 4 includes a (plural) number of storage stages 34 that is given by the parameter A (which has a plural numerical value (i.e., a numerical value sufficiently greater than 1) to help make circuitry 10' usable in a relatively wide range of possible applications). Each storage stage 34 includes M registers 32 (not shown individually in FIG. 4, but similar to registers 32 in FIG. 1). M is again a parameter having a numerical value sufficiently greater than 1 to help make circuitry 10' usable in a relatively wide range of possible applications. The muxes stage of circuitry 10' includes N M-to-1 muxes 62, connected as described for the similar muxes 62 in FIG. 1. Once again, N is a parameter having a numerical value sufficiently greater than 1 to help make circuitry 10' usable in a wide range of possible applications.

Although constructed with the just-described fixed size, circuitry 10' can operate as data width scaler circuitry in any application in which above-described parameter m (or $m_d$) is less than or equal to M, above-described parameter n (or $n_d$) is less than or equal to N, and above-described parameter ∝ (or $\propto_d$) is less than or equal to A. The actual data width scaler operation that circuitry 10' performs in any given application is determined by the (controllably selected or variable) values of m, n, and ∝ that are applied to circuitry 80. (FIG. 4 also shows that a (controllably selected or variable) value of β can also be applied to circuitry 80 as described earlier in the specification.)

Figure 5:
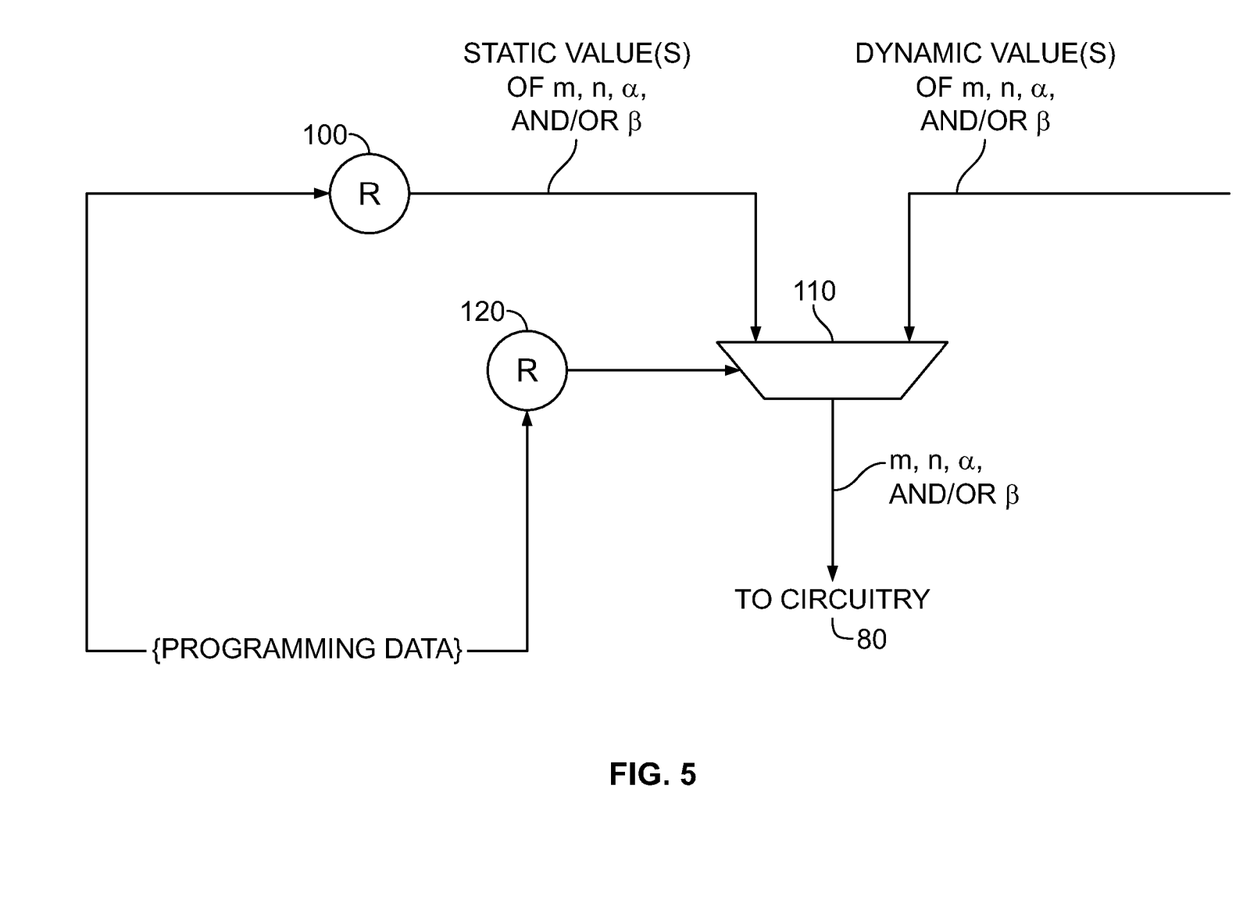
FIG. 5 is a simplified schematic block diagram of an illustrative embodiment of circuitry for supplying certain control signals to circuitry like that shown in FIG. 1 or FIG. 4 in accordance with certain possible aspects of the disclosure.

FIG. 5 shows some examples of how one or more of parameter values m, n, ∝, and/or β may be applied to select control logic 80 in FIG. 1 or FIG. 4. Registers 100 (e.g., configuration random access memory ("CRAM") elements) on an integrated circuit ("IC") that includes circuitry 10/10') may be programmed with desired value(s) of one or more of parameters m, n, ∝, and/or β. The outputs of registers 100 are applied to one set of selectable inputs to multiplexer ("mux") 110. These inputs to mux 100 may be described as "static" because they typically do not change over time during so-called normal or user-mode operation of the IC. (This may be so because registers 100 are programmed only relatively infrequently (e.g., when the IC is first initialized or subsequently re-initialized).) More "dynamic" values for one or more of parameters m, n, ∝, and/or β can be applied to a second set of selectable inputs to mux 110. For example, these more dynamic values may be subject to change from time to time during normal or user-mode operation of the IC. They may come from a source external to the IC, or they may come from circuitry on the IC that is controllable during user-mode operation of the IC. Mux 110 may be controlled by a selection control signal applied to it (e.g., from another CRAM cell 120) to select either one of its two selectable sets of inputs as the outputs that are applied to the m, n, ∝, and/or β inputs to circuitry 80. Thus, especially in cases in which circuitry 10 has the general-purpose construction 10' shown in FIG. 4, the particular data width scaler operation(s) performed by circuitry 10' can be either programmed into the IC that includes circuitry 10' (e.g., using CRAM elements 100), or more dynamically controlled via the other set of selectable inputs to mux 110. And CRAM 120 determines whether the control of the data width scaler is static (e.g., from CRAM elements 100) or more dynamic (e.g., from the other inputs to mux 110).

FIG. 6 shows an example of an illustrative embodiment of a larger context in which data width scaler circuitry 10 or 10' (as described above) may be used. For example, the circuitry shown in FIG. 6 may all be part of the circuitry on an integrated circuit ("IC") 200. This IC may include deserializer and physical media access ("DESER/PMA") circuitry 210 for receiving a serial data signal (e.g., from a source external to IC 200) and converting that serial data signal information to parallel form on bus 20. Circuitry 210 also produces the above-described clkm signal. Bus 20 is connected to data width scaler circuitry 10/10' as described earlier. The clkm signal is also applied to circuitry 10/10' as described earlier. Circuitry 10/10' converts the width of the data on bus 20 to a (typically) different width on bus 90 as described earlier. Circuitry 10/10' also produces the above-described validout signal.

Circuitry downstream from circuitry 10/10' may make use of the data output by circuitry 10/10'. In the example shown in FIG. 6, the validout signal produced by circuitry 10/10' may be used as a so-called global data valid signal. In other words, this one validout signal is applied to all of downstream circuit elements 220-1, 220-2, 220-3, etc. to tell each of those circuit elements which cycles of the clkm signal (also applied to all of elements 220-1, 220-2, etc.) are cycles in which the data outputs of the upstream elements are valid. In still other words, in this embodiment, the one validout signal produced by circuitry 10/10' can be used as an enabling signal for clkm in each of elements 220-1, 220-2, etc.

An alternative embodiment of circuitry somewhat like the FIG. 6 circuitry is shown in FIG. 7. Again, everything shown in FIG. 7 may be on an integrated circuit 200'. Elements 210 and 10/10' in FIG. 7 may be as described above for FIG. 6. In this case, however, the validout signal produced by circuitry 10/10' (now identified as validout1) is used only by immediately downstream circuit element 220'-1. That element then produces its own validout2 signal that is used by the next downstream circuit element 220'-2. Circuit element 220'-2 produces another validout3 signal for use by the next downstream element 220'-3. This arrangement may continue as long as needed, and it may be referred to as a propagated data valid architecture.

Another alternative embodiment of circuitry somewhat like the FIGS. 6 and 7 circuitry is shown in FIG. 8. Once again, everything shown in FIG. 8 may be on a single integrated circuit 200". Elements 210 and 10/10' in FIG. 8 may be as described above for FIGS. 6 and 7. In FIG. 8, however, the validout signal produced by circuit 10/10' (identified as validout1) is used by several (but not all) of downstream circuit elements 220". In particular, the validout1 signal from element 10/10' is used by downstream circuit elements 220"-1 and 220"-2, but not by further downstream circuit element 220"-3. Circuit element 220"-2 generates a new validout3 signal for use by circuit element 220"-3 (in lieu of using validout1), and circuit element 220"-3 generates a still further validout4 signal for use by still further downstream circuit elements. An architecture like that shown in FIG. 8 may be referred to as a hybrid data valid architecture (because it begins by looking like the global data valid architecture of FIG. 6 (e.g., for the first several downstream circuit elements like 220"-1 and 220"-2), but then shifts to looking like the propagated data valid architecture of FIG. 7 (e.g., for circuit elements downstream from 220"-2)).

In the global data valid architecture (FIG. 6) the "data valid" generated by data width scaler 10/10' is connected to all of the blocks 220 in the design that further process or use the data output by the scaler. The data can thereby be processed by all blocks at the same time when the data valid is active, and pauses the processing when it is inactive. Possible advantages of this architecture are as follows. It can simplify the design of blocks in the architecture. It can facilitate the use of old designs (e.g., from known products) with minimal modifications. There is less risk of design errors when re-using old designs. A possible disadvantage of this architecture is as follows. Because the data is processed by the design only when data valid is active, latency of the entire design may be greater (the design does not process any data when data valid is inactive).

In the propagated data valid architecture (FIG. 7) the "data valid" generated by data width scaler circuitry 10/10' is connected to the first downstream block 220'-1 in the design. Each downstream block 220' generates a new data valid signal that is connected to the next downstream block in the design. A possible advantage of this approach is as follows. The design may have less latency (i.e., time delay between availability of input data to availability of resulting output data) because data processing is done as soon as possible in each block, which may include processing data even when data farther upstream is not valid. Possible disadvantages of this approach are as follows. It may complicate the design of certain blocks in the architecture. It may not be possible to re-use old blocks from prior, known designs (at least not without major modifications). It may increase the risk of design errors when re-using old designs.

In the hybrid data valid architecture (e.g., FIG. 8) the "data valid" generated by data width scaler 10/10' is used as in a mixture of the global and propagated data valid architectures. The mixture that is employed can be selected based on considerations such as the acceptable amount of latency and the old-block re-use constraints of the design. Possible advantages of the hybrid data valid architecture are as follows. It may be possible to re-use old designs with minimal modifications. There can be less risk of design errors when re-using old designs. Total latency can be better than for an exclusively global data valid architecture.

In some respects recapitulating and/or extending the foregoing, certain possible aspects of this disclosure relate to circuitry (e.g., 10, 10') for converting data received in successive input groups of data bits (e.g., X[m−1]:0]), each of the input groups including a first number (e.g., m) of the data bits, to successive output groups of the data bits (e.g., Y[(n−1):0]), each of the output groups including a second number (e.g., n) of the data bits that is different from the first number. Such circuitry for converting may include register circuitry (e.g., 32, 34) for storing a plurality of most recent ones the input groups and for outputting in parallel all of the data bits in the input groups that are currently stored in the register circuitry. Such circuitry for converting may further include a plurality of multiplexer circuitries (e.g., 62), each of which is respectively associated with a unique subset of adjacent ones of the data bits output by the register circuitry (e.g., mux 62-0 is associated with subset $X_{\alpha-1}[0]$ through $X_{\alpha-1}[m-1]$; mux 62-1 is associated with subset $X_{\alpha-1}[1]$ through $X_{\alpha-1}[m-1]$ and $X_{\alpha-2}[0]$; mux 62-2 is associated with subset $X_{\alpha-1}[2]$ through $X_{\alpha-1}[m-1], X_{\alpha-2}2[0]$, and $X_{\alpha-2}[1]$; etc.), each of the subsets including the first number (e.g., m) of data bits, and each multiplexer circuitry being controllable to select any one of the data bits in its associated subset as a respective data bit in an output group (e.g., $Y[n-1):0]$).

In circuitry as recapitulated above, the register circuitry may comprise a plurality of storage stages (e.g., 34-0, 34-1, ..., 34-($\alpha$−1)), each of which can store an input group (e.g., $X[(m-1):0]$). The storage stages may be connected to one another in series (e.g., via connections 36). The register circuitry may shift each stored input group (e.g., $X[(m-1):0]$) to a next storage stage in the series in response to receiving and storing in an initial one of the storage stages (e.g., 34-0) a new most-recent input group (e.g., $X[m-1):0]$).

In such circuitry, the register circuitry (e.g., 34) stores each new most-recent input group (e.g., $X[(m-1):0]$) in synchronism with a clock signal (e.g., clkm). The clock signal may be gated by a validin signal so that the register circuitry (e.g., 34) stores a new most-recent input group (e.g., $X[(m-1):0]$ in synchronism with the clock signal only when the validin signal is asserted Circuitry as is here being recapitulated may further include select control logic circuitry (e.g., 80) for controlling which of the data bits (e.g., X) in the subset associated with each of the multiplexer circuitries (e.g., 62) that multiplexer circuitry selects as the respective data bit (e.g., Y) in an output group (e.g., $Y[(n-1):0]$). In such circuitry, the select control logic circuitry may be responsive to a first signal (e.g., m) indicative of the first number, a second signal (e.g., n) indicative of the second number, a third signal (e.g., $\alpha$) indicative of a number of storage stages in the plurality of storage stages, and a clock signal (e.g., clkm). Also in such circuitry, the clock signal may be synchronized with the successive input groups (e.g., $X[(m-1):0]$).

In circuitry as is here being recapitulated, the select control logic circuitry (e.g., 80) may additionally produce a validout signal when the data bits selected by the multiplexer circuitries (e.g., 62) constitute a valid output group (e.g., $Y[(n-1):0]$).

Circuitry as is here being recapitulated may further include circuitry for producing a validout signal when the data bits selected by the multiplexer circuitries (e.g., 62) constitute a valid output group (e.g., $Y[(n-1):0]$). Such circuitry may further include first utilization circuitry (e.g., 220-1, 220'-1, 220"-1) for receiving (1) the data bits selected by the multiplexer circuitries (e.g., $Y[(n-1):0]$), (2) the validout signal, and (3) a clock signal (e.g., clkm) that is synchronized with the successive input groups (e.g., $X[(m-1):0]$), wherein the first utilization circuitry inputs the data bits selected by the multiplexer circuitries in synchronism with the clock signal, but only when the validout signal is asserted. In such circuitry, the first utilization circuitry (e.g., 220'-1) may produce (1) a further output group (e.g., n) and (2) a further validout signal (e.g., validout2). The circuitry may then still further include second utilization circuitry (e.g., 220'-2) for receiving (1) the further output group, (2) the further validout signal, and (3) the clock signal, wherein the second utilization circuitry inputs the further output group in synchronism with the clock signal, but only when the further validout signal is asserted.

In circuitry as is here being recapitulated, the first number (e.g., m) may be selectable from a plurality of different values within a range of possible values (e.g., up to M). In such a case, the circuitry may further include programmable circuitry (e.g., 100) for storing programming data indicative of a selected value for the first number. Similarly, the second number (e.g., n) may be selectable from a plurality of different values within a range of possible values (e.g., up to N). In such a case, the circuitry may further include programmable circuitry (e.g., 100) for storing programming data indicative of a selected value for the second number.

Further recapitulating and/or extending the foregoing, certain possible aspects of the disclosure relate to circuitry (e.g., 10, 10') for converting scaler input data signals (e.g., $X[(m-1):0]$) that are received in a first bit-width (e.g., m) in synchronism with a clock signal (e.g. clkm) to scaler output data signals (e.g., $Y[(n-1):0]$) that are output in a second bit-width (e.g., n) in synchronism with the clock signal, the second bit-width being different from the first bit-width. Such circuitry for converting may include shift register circuitry (e.g., register groups 34-0, ..., 34-($\alpha$−1) connected in series via leads 36) comprising a plurality of registers (e.g., 32), each of which can receive, store, and output one bit of data (e.g., X) in synchronism with the clock signal when a validin signal is asserted. Such circuitry for converting may further include routing circuitry (e.g., 36) for connecting multiple, mutually exclusive, but adjacent subpluralities (e.g., 34) of adjacent ones of the registers in a series of such subpluralities in which a first of the subpluralities (e.g., 34-0) receives the scaler input data signals (e.g., $X[(m-1):0]$), and each succeeding subplurality (e.g., 34-1, 34-2, etc.) receives the data signals output by an immediately preceding one of the subpluralities. Such circuitry for converting may still further include a plurality of multiplexer circuitries (e.g., 62), each of which is associated with a respective different submultiplicity of adjacent ones of the registers (e.g., mux 62-0 is associated with submultiplicity $X_{\alpha-1}[0]$ through $X_{\alpha-1}[m-1]$; mux 62-1 is associated with submultiplicity $X_{\alpha-1}[1]$ through $X_{\alpha-1}[m-1]$ and $X_{\alpha-2}[0]$; mux 62-2 is associated with submultiplicity $X_{\alpha-1}[2]$ through $X_{\alpha-1}[m-1], X_{\alpha-2}[0]$, and $X_{\alpha-2}[1]$; etc.), each submultiplicity having the first bit-width (e.g., m), and each submultiplicity including one of the registers that none of the other submultiplicities includes, each of the multiplexer circuitries being controllable (e.g., from circuitry 80) to select as a data output signal (e.g., Y) of that multiplexer circuitry the bit of data (e.g., X) being output by any one of the registers (e.g., 32) in the submultiplicity associated with that multiplexer circuitry, the data signals output by the multiplexer circuitries in synchronism with the clock signal when a validout signal is asserted constituting the scaler data output signals (e.g., $Y[(n-1):0]$).

Circuitry as recapitulated above may further include control circuitry (e.g., 80) for controlling selection made by each of the multiplexer circuitries (e.g., 62).

In circuitry as recapitulated above, the first bit-width (e.g., m) may be programmably selectable. Alternatively or in addition, the second bit-width (e.g., n) may be programmably selectable. In such circuitry, the control circuitry may additionally produce the validout signal.

In circuitry as recapitulated above, the control circuitry may be responsive to the first bid-width (e.g., m) and the second bit-width (e.g., n).

In circuitry as is here being recapitulated, the submultiplicities may be incrementally different from one another in a progression in which each successive submultiplicity includes one and only one more register (e.g., 32) than an immediately preceding submultiplicity in the progression included.

In circuitry as is here being recapitulated, each of the subpluralities may have the first bit-width (e.g., m).

Still further recapitulating and/or extending the foregoing, certain possible aspects of the disclosure relate to circuitry (e.g., 10, 10') for scaling data (e.g., X) from a first width (e.g., m) to a second width (e.g., n) in synchronism with a clock signal (e.g., clkm). Such circuitry may include storage stage circuitry (e.g., 32, 34) for receiving input data (e.g., X[(m−1):0]) having the first width (e.g., m) and storing a plurality of successive groups of such data in a plurality of registers (e.g., register groups 34-0, 34-1, etc.). The circuitry may further include a plurality of multiplexer circuitries (e.g., 62), each of which is associated with a different submultiplicity of the registers (e.g., mux 62-0 is associated with submultiplicity $X_{\alpha-1}[0]$ through $X_{\alpha-1}[m-1]$; mux 62-1 is associated with submultiplicity $X_{\alpha-1}[1]$ through $X_{\alpha-1}[m-1]$ and $X_{\alpha-2}[0]$; mux 62-2 is associated with submultiplicity $X_{\alpha-1}[2]$ through $X_{\alpha-1}[m-1]$, $X_{\alpha-2}[0]$, and $X_{\alpha-2}[1]$; etc.), and each of which is controllable (e.g., from circuitry 80) to select as an output signal (e.g., Y) of that multiplexer circuitry an output signal (e.g., X) of any one of the registers (e.g., 32) in the submultiplicity associated with that multiplexer circuitry, the output signals of the multiplexer circuitries constituting output data (e.g., Y[(n−1):0]) of the circuitry for scaling and having the second width (e.g., n).

Circuitry as recapitulated above may further include circuitry (e.g., 80) for controlling selections made by the multiplexer circuitries (e.g., 62). In such circuitry, the circuitry for controlling may be responsive to a controllably variable parameter (e.g., m) indicative of the first width. Also in such circuitry, the circuitry for controlling may be additionally responsive to a second controllably variable parameter (e.g., n) indicative of the second width.

In circuitry as recapitulated above, the storage circuitry (e.g., 34) may store successive groups (e.g., X[(m−1):0]) while a validin signal is asserted.

In circuitry as recapitulated above, the output signals (e.g., Y) of the multiplexer circuitries (e.g., 62) constitute the output data (e.g., Y[(n−1):0]) of the circuitry for scaling while a validout signal is asserted.

It will be understood that the foregoing is only illustrative of the principles of this disclosure, and that various modifications can be made by those skilled in the art without departing from the scope and spirit of the disclosure. For example, although each of FIGS. 6-8 is described above as showing elements that are all part of a single integrated circuit ("IC"), some of the elements shown in each of these FIGS. can be on one integrated circuit, while one or more other elements are on one or more other integrated circuits. As another example of modifications within the scope of this disclosure, in some embodiments it may be possible to temporarily stop a clock when data associated with that clock is not valid. Any type of integrated circuit may be provided with data width scaler circuitry in accordance with this disclosure. Some specific examples of such integrated circuits are programmable logic devices ("PLDs"), field-programmable gate arrays ("FPGAs"), programmable microcontrollers, etc.

What is claimed is:

1. Circuitry for converting data received in successive input groups of data bits, each of the input groups including a first number of the data bits, to successive output groups of the data bits, each of the output groups including a second number of the data bits that is different from the first number, comprising:
    register circuitry for storing a plurality of most recent ones the input groups and for outputting in parallel all of the data bits in the input groups that are currently stored in the register circuitry; and
    a plurality of multiplexer circuitries, each of which is respectively associated with a unique subset of adjacent ones of the data bits output by the register circuitry, each of the subsets including the first number of data bits, and each multiplexer circuitry being controllable to select any one of the data bits in its associated subset as a respective data bit in an output group.

2. The circuitry defined in claim 1 wherein the register circuitry comprises a plurality of storage stages, each of which can store an input group, wherein the storage stages are connected to one another in series, and wherein the register circuitry shifts each stored input group to a next storage stage in the series in response to receiving and storing in an initial one of the storage stages a new most-recent input group.

3. The circuitry defined in claim 2 wherein the register circuitry stores each new most-recent input group in synchronism with a clock signal.

4. The circuitry defined in claim 3 wherein the clock signal is gated by a validin signal so that the register circuitry stores a new most-recent input group in synchronism with the clock signal only when the validin signal is asserted.

5. The circuitry defined in claim 2 further comprising:
    select control logic circuitry for controlling which of the data bits in the subset associated with each of the multiplexer circuitries that multiplexer circuitry selects as the respective data bit in an output group.

6. The circuitry defined in claim 5 wherein the select control logic circuitry is responsive to a first signal indicative of the first number, a second signal indicative of the second number, a third signal indicative of a number of storage stages in the plurality of storage stages, and a clock signal.

7. The circuitry defined in claim 6 wherein the clock signal is synchronized with the successive input groups.

8. The circuitry defined in claim 6 wherein the select control logic circuitry additionally produces a validout signal when the data bits selected by the multiplexer circuitries constitute a valid output group.

9. The circuitry defined in claim 2 further comprising:
    circuitry for producing a validout signal when the data bits selected by the multiplexer circuitries constitute a valid output group.

10. The circuitry defined in claim 9 further comprising:
    first utilization circuitry for receiving (1) the data bits selected by the multiplexer circuitries, (2) the validout signal, and (3) a clock signal that is synchronized with the successive input groups, wherein the first utilization circuitry inputs the data bits selected by the multiplexer circuitries in synchronism with the clock signal, but only when the validout signal is asserted.

11. The circuitry defined in claim 10 wherein the first utilization circuitry produces (1) a further output group and (2) a further validout signal, and wherein the circuitry further comprises:
    second utilization circuitry for receiving (1) the further output group, (2) the further validout signal, and (3) the clock signal, wherein the second utilization circuitry inputs the further output group in synchronism with the clock signal, but only when the further validout signal is asserted.

12. The circuitry defined in claim 6 wherein the first number is selectable from a plurality of different values within a range of possible values.

13. The circuitry defined in claim 12 further comprising:
    programmable circuitry for storing programming data indicative of a selected value for the first number.

14. The circuitry defined in claim 12 where the second number is selectable from a plurality of different values within a range of possible values.

15. The circuitry defined in claim 14 further comprising:
programmable circuitry for storing programming data indicative of a selected value for the second number.

16. Circuitry for converting scaler input data signals that are received in a first bit-width in synchronism with a clock signal to scaler output data signals that are output in a second bit-width in synchronism with the clock signal, the second bit-width being different from the first bit-width, the circuitry comprising:
shift register circuitry comprising a plurality of registers, each of which can receive, store, and output one bit of data in synchronism with the clock signal when a validin signal is asserted;
routing circuitry for connecting multiple, mutually exclusive, but adjacent subpluralities of adjacent ones of the registers in a series of such subpluralities in which a first of the subpluralities receives the scaler input data signals, and each succeeding subplurality receives the data signals output by an immediately preceding one of the subpluralities; and
a plurality of multiplexer circuitries, each of which is associated with a respective different submultiplicity of adjacent ones of the registers, each submultiplicity having the first bit-width, and each submultiplicity including one of the registers that none of the other submultiplicities includes, each of the multiplexer circuitries being controllable to select as a data output signal of that multiplexer circuitry the bit of data being output by any one of the registers in the submultiplicity associated with that multiplexer circuitry, the data signals output by the multiplexer circuitries in synchronism with the clock signal when a validout signal is asserted constituting the scaler data output signals.

17. The circuitry defined in claim 16 further comprising:
control circuitry for controlling selection made by each of the multiplexer circuitries.

18. The circuitry defined in claim 16 wherein the first bit-width is programmably selectable.

19. The circuitry defined in claim 16 wherein the second bit-width is programmably selectable.

20. The circuitry defined in claim 17 wherein the control circuitry additionally produces the validout signal.

21. The circuitry defined in claim 17 wherein the control circuitry is responsive to the first bit-width and the second bit-width.

22. The circuitry defined in claim 16 wherein the submultiplicities are incrementally different from one another in a progression in which each successive submultiplicity includes one and only one more register than an immediately preceding submultiplicity in the progression included.

23. The circuitry defined in claim 16 wherein each of the subpluralities has the first bit-width.

24. Circuitry for scaling data from a first width to a second width in synchronism with a clock signal comprising:
storage stage circuitry for receiving input data having the first width and storing a plurality of successive groups of such data in a plurality of registers; and
a plurality of multiplexer circuitries, each of which is associated with a different submultiplicity of the registers, and each of which is controllable to select as an output signal of that multiplexer circuitry an output signal of any one of the registers in the submultiplicity associated with that multiplexer circuitry, the output signals of the multiplexer circuitries constituting output data of the circuitry for scaling and having the second width, wherein at least two multiplexer circuitries of the plurality of multiplexer circuitries share the output signal of at least one register of the plurality of registers as input.

25. The circuitry defined in claim 24 further comprising:
circuitry for controlling selections made by the multiplexer circuitries.

26. The circuitry defined in claim 25 wherein the circuitry for controlling is responsive to a controllably variable parameter indicative of the first width.

27. The circuitry defined in claim 26 wherein the circuitry for controlling is additionally responsive to a second controllably variable parameter indicative of the second width.

28. The circuitry defined in claim 24 wherein the storage circuitry stores successive groups while a validin signal is asserted.

29. The circuitry defined in claim 24 wherein the output signals of the multiplexer circuitries constitute the output data of the circuitry for scaling while a validout signal is asserted.

* * * * *